United States Patent [19]

Roth et al.

[11] 4,051,010
[45] Sept. 27, 1977

[54] SPUTTERING APPARATUS

[75] Inventors: Marvin E. Roth; Donald J. Vallere, both of Reading, Pa.

[73] Assignee: Western Electric Company, Inc., New York, N.Y.

[21] Appl. No.: 758,300

[22] Filed: Jan. 10, 1977

Related U.S. Application Data

[62] Division of Ser. No. 642,043, Dec. 18, 1975, Pat. No. 4,022,939.

[51] Int. Cl.$^2$ ............................................. C23C 15/00
[52] U.S. Cl. ................................................... 204/298
[58] Field of Search ............... 204/192, 298; 118/49.1, 118/48, 49

[56] References Cited

U.S. PATENT DOCUMENTS

| | | | |
|---|---|---|---|
| 3,046,936 | 1/1962 | Simons, Jr. | 118/49.1 |
| 3,213,825 | 10/1965 | Cooper et al. | 118/49 |
| 3,652,444 | 3/1972 | Lester et al. | 204/298 |
| 3,856,654 | 12/1974 | George | 204/298 |
| 3,864,239 | 2/1975 | Fletcher et al. | 204/298 |
| 3,981,791 | 9/1976 | Rosvold | 204/298 |

OTHER PUBLICATIONS

C. H. George, "Cylindrical Diode Continuous, Vacuum Sputtering Equipment for Laboratory & High Volume Production," *J. Vac. Sci. Tech.* vol. 10, Mar./Apr. 1973, (pp. 393–397).

*Primary Examiner*—Donald L. Walton
*Assistant Examiner*—Aaron Weisstuch
*Attorney, Agent, or Firm*—R. Y. Peters

[57] ABSTRACT

A sputtering apparatus of the bell-jar type includes a high-vacuum pump disposed centrally of, and directly within a vacuum chamber of the apparatus. A separate enclosing member is disposed within the chamber and allows selective exposure of the pump to the chamber. An annular workholder is mounted in concentric surrounding relation with the pump, and an apertured, annular shutter is mounted in concentric surrounding relation with the workholder. Targets of materials to be sputter deposited on the workpieces are mounted on the inside wall of the main enclosure of the apparatus. The shutter and the workholder are moved in synchronism at the beginning and at the end of the deposition cycle to provide a uniform exposure of all the workpieces to the targets.

2 Claims, 7 Drawing Figures

SPUTTERING APPARATUS

This is a division of application Ser. No. 642,043 filed Dec. 18, 1975, now U.S. Pat. No. 4,022,939.

BACKGROUND OF THE INVENTION

This invention relates to vacuum treating apparatus, and particularly, but not limited to, high production, high quality sputtering apparatus for depositing materials on substrates.

Various vacuum treating apparatus, including various conventional sputtering apparatus, require a vacuum pump down each time a batch of workpieces is loaded into the apparatus. The pump down time can be quite extensive, often being an appreciable portion of the entire processing sequence, and it is thus desirable to reduce it. This is one object of this invention.

Obtaining reproducible results from workpiece to workpiece requires that all the workpieces be treated or operated on in substantially identical fashion. One problem heretofore existing in certain types of vacuum treating apparatus in which different workpieces of a batch of workpieces are successively operated on over a period of time is that of providing uniform treating conditions throughout the treating period, particularly at the beginning and end of the period.

A further object of this invention is to provide uniform and reproducible treatment of different workpieces successively operated on in a vacuum treating process.

PREFERRED EMBODIMENTS OF THE INVENTION

Figures 1, 2:
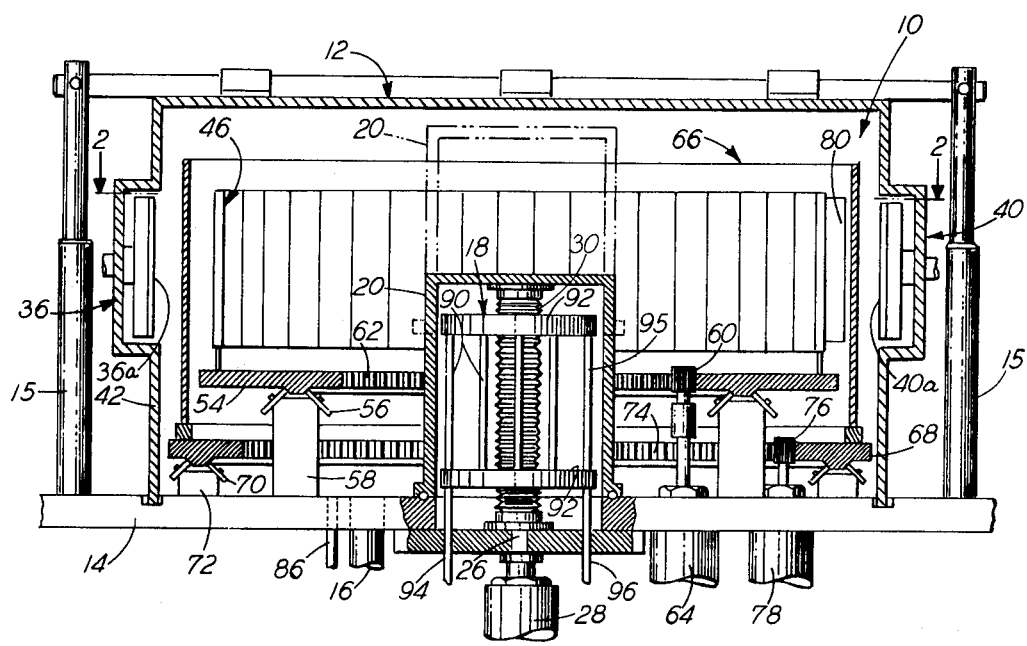
FIG. 1 is a sectional elevational view of a sputtering apparatus in accordance with one embodiment of this invention.
FIG. 2 is a sectional view taken along line 2—2 of FIG. 1.

Shown in FIG. 1 is a sputtering apparatus 10 of the present invention. The apparatus 10 is basically of the bell jar type, and comprises a cup-shaped, generally cylindrical main enclosure 12 in removable, hermetically sealable relation with a base plate 14. A pneumatic lifting means 15 of known type is provided for lifting the enclosure 12 away from the plate 14 and exposing the work treatment chamber of the apparatus.

To pump down the apparatus 10, conventional pump means can be used. For example, to pump down the apparatus from atmospheric pressure to an "intermediate" level of pressure, e.g., about 100 torr, a conventional roughing pump (not shown) can be used coupled to the apparatus via a duct 16 through the base plate 14. To pump down the apparatus to a further reduced pressure, e.g., about $5 \times 10^{-5}$ torr, a known combination of a turbomolecular pump backed up by a foreline pump (neither pump being shown) can be used coupled to the apparatus via a duct 17 (see FIG. 2). To achieve a relatively "high" vacuum, e.g., about $5 \times 10^{-7}$ torr to "clean out" the apparatus prior to the actual operation thereof, a high vacuum pump 18 (FIG. 1) is also provided. In accordance with this invention, the high vacuum pump 18, e.g., a cryogenic pump of known type described in some detail hereinafter, is mounted on the base plate 14 interiorly of the apparatus itself. The importance of this disposition of the pump within the apparatus is described hereinafter.

To isolate the pump 18 from the ambient air when the enclosure 12 is lifted, as well as to isolate the pump from surrounding portions of the apparatus 10 during its operation, as described below, a separate cap member or enclosure 20 is provided which forms an hermetic seal with the base plate 14. To substantially fully expose the pump 18 to the surrounding portions of the apparatus, the enclosure 20 is lifted (as shown in phantom in FIG. 1) within the main enclosure 12 by means of a drive screw 26 driven by a motor 28 mounted beneath the base plate 14. A bellows 30 hermetically sealed to the screw 26 within the apparatus preserves the hermeticity thereof as the screw is advanced or retracted within the apparatus.

Four cathode target assemblies 34, 36, 38 and 40 (FIG. 2), each including a target 34a, 36a, 38a and 40a, respectively, of a material to be sputter-deposited onto workpieces within the apparatus 10, are mounted inside the apparatus 10 on the side wall 42 of the main enclosure 12. The target assemblies comprise the "work treating means" in this embodiment of the invention. Electrical connections and water cooling means are coupled to the target assemblies through the wall 42. In this embodiment of the invention the target assemblies are angularly disposed 90° from each other, the two oppositely disposed assemblies 34 and 38 including targets 34a and 38a of titanium, and the two oppositely disposed assemblies 36 and 40 including targets 36a and 40a of platinum. Each of the targets extends generally parallel to the longitudinal axis of the apparatus. More than four target assemblies, and targets of different materials, can be used, as desired.

The target assemblies are designed in accordance with known principles and can comprise, e.g., a hollow housing through which cooling water is circulated. The targets comprise, e.g., a rectangular plate of the material to be sputter deposited secured to the interior facing wall of the target assembly housing. Illustrative dimensions of the various targets are provided hereinafter.

Figure 3:
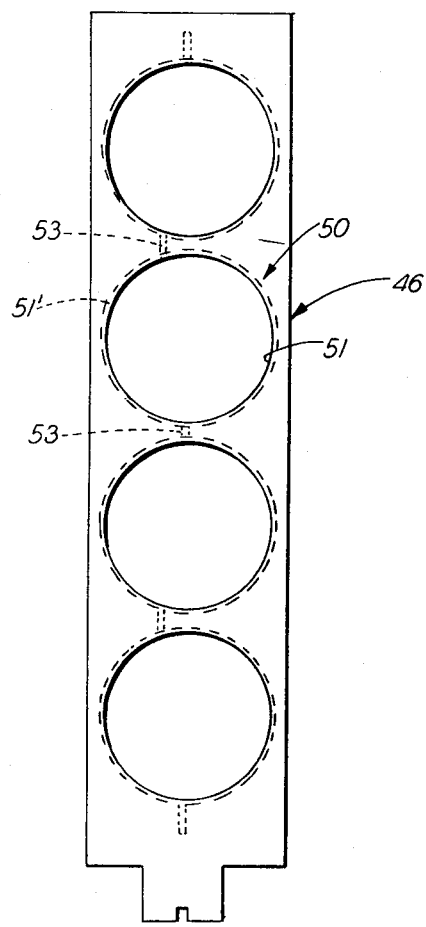
FIG. 3 is a front view of a workpiece holder, or pallet, used in the apparatus shown in FIGS. 1 and 2.
Figure 4:
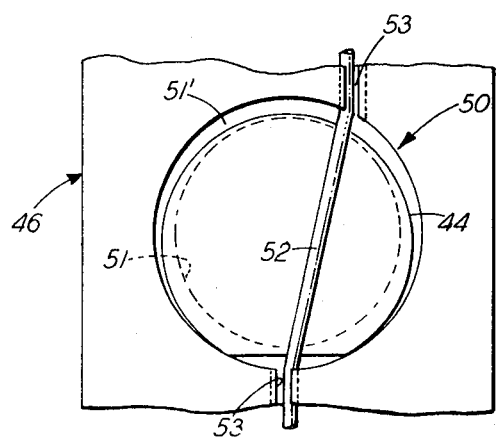
FIG. 4 is an enlarged view of a back portion of the pallet shown in FIG. 3.

While any number of different workpieces, or a single workpiece, can be operated on by the instant apparatus, in this embodiment of the invention the workpieces comprise 3 inch diameter disc-like wafers 44 (FIG. 4) of semiconductor material. Workholders for the wafers 44 include a known type of pallet 46 (FIGS. 3 and 4), each pallet being a relatively thin, rectangular plate containing a number of counterbored apertures 50 therethrough, the smaller diameter portion 51 of the apertures 50 on the "front" side (FIG. 3) of the pallet 46 providing a ledge 51' for receipt of the wafers. Each wafer 44 is held in place (FIG. 4) against the ledge 51' by means of a resilient wire 52 extending across the aperture 50 between dove-tail shaped grooves 53 on the back side of the pallet.

The loaded pallets 46 are mounted, in turn, on a rotatable annular platform or "carrousel" 54 (FIG. 1) within the apparatus 10, the different pallets being disposed in a side-by-side, vertical, cylindrical "work assembly" or array on the carrousel. Simple spring detent means (not shown) can be used to hold the pallets in place. For 3 inch wafers 44, each pallet 46 measures 3⅝ by 14¾ inches, the carrousel 54 having an outer diameter of about 30 inches, and mounting thereon 26 pallets 46.

The annular carrousel 54 is mounted concentrically around the pump 18 on bearings 56 mounted, in turn, on a number of support posts 58 spaced around the pump 18. The carrousel 54 is rotatable by means of a gear 60 engaged with a gear track 62 on the inside surface of the annular carrousel, the gear 60 being driven by a motor 64 mounted beneath the base plate 14. As described in greater detail below, the carrousel 54 rotates the various pallets 46 successively past different ones of the target assemblies 34, 36, 38 and 40, whereby materials sputtered from the targets are deposited onto the wafers carried by the pallets.

Cooperating with the carrousel 54 for controlling the uniformity and purity of material deposited onto the wafers 44 at the beginning and end of the processing cycles, as described hereinafter, is a cylindrical shutter 66 mounted on an annular, rotatable platform 68. The platform 68 is mounted on bearings 70 mounted on support posts 72 spaced around the pump 18, the shutter 66 being disposed, as shown, in concentric surrounding relation with the array of pallets 46 on the carrousel 54. The inside surface of the annular shutter platform 68 is provided with a gear track 74, and rotation of the platform 68 and the shutter 66 thereon is by means of a gear 76 driven by a motor 78 mounted beneath the base plate 14. The shutter 66 has an outer diameter of 33 inches, a wall thickness of 1/16 inch, and is spaced from each target (the centers of the flat plates thereof) a distance of 1¼ inches.

As shown in FIG. 2, the cylindrical shutter 66 has two rectangular apertures 80 and 82 therethrough disposed 180° apart, each aperture extending in the longitudinal direction and corresponding generally in shape and dimensions with the targets of the target assemblies 34, 36, 38 and 40.

For example, each target 34a, 36a, 38a and 40a of the various target assemblies has a height of 16 inches and a width of 11 inches. The shutter apertures 80 and 82 have a height of 15½ inches and a width of 10½ inches.

A source of gas (e.g., argon) is connected to the apparatus via a pipe 86 extending through the base plate 14.

The various apparatus portions above-referred to, e.g., the pallets 46, the carrousel 54, the shutter 66, etc., are preferably made of stainless steel.

As previously indicated, apparatus for sputter depositing materials onto workpieces are well known, and structural and processing details, e.g., the electrical power supplies, the various control circuits, the target assemblies, and the like used with the apparatus 10 are not described as being known and a matter of choice to workers in these arts.

INTERNAL HIGH VACUUM PUMP

Of particular importance is the disposition of a high vacuum pump 18 directly within and centrally of the the apparatus 10 itself, i.e., along the longitudinal axis of the work treating chamber of the apparatus. In general, rotary vacuum treating apparatus of the type herein described are known (see, e.g., U.S. Pat. No. 3,400,066, issued to Caswell, et al. on Sept. 3, 1968, the disclosure thereof being incorporated herein by reference), an advantage of such apparatus being that relatively large numbers of workpieces can be processed in each batch processing cycle of operation. One limitation on the production rate of such known apparatus, however, is the time it takes to pump down the apparatus.

In apparatus of the type described herein, the disposition of the pump 18 directly within the apparatus greatly reduces the pump down time. This is because the gas conductance, i.e., the rate of flow of gases to the gas collecting or high vacuum pump, is not limited by the cross-sectional area, length, or shape of ducts leading from the apparatus to the pump. In effect, the cross-sectional area with respect to the conductance of gases to the pump 18 in apparatus according to the instant invention is in the order of the peripheral area of the centrally located pump itself, i.e., the area of a cylinder encircling the pump. Also, being centrally disposed and within the apparatus itself, the path length for gases to the pump is at a minimum.

In the instant embodiment, the pump 18 (FIG. 1) is a known type of cryogenic pump comprising a plurality of vertical tubes 90 mounted between a pair of horizontal annular tubes 92. Liquid nitrogen is pumped into the lower tube 92 via an entrance pipe 94, rises through the vertical tubes 90 to the upper tube 92, and is vented through a vertical tube 95 to an exit pipe 96. This type of pump collects gases which freeze at a temperature higher than that of liquid nitrogen, e.g., oxygen and water vapor, such gases freezing and collecting on the cold outer surfaces of the pump elements.

When exposed to the surrounding apparatus, i.e., when the pump enclosure 20 is in its raised position (FIG. 1), substantially the entire surface area of the pump is directly exposed to the surrounding apparatus and the apparatus gases can flow along basically unimpeded, direct paths to the pump. Thus, the effective cross-sectional area for gas flow to the pump is quite high, and is significantly greater than that of conventional ducts normally used to connect high vacuum pumps to chambers being evacuated. Accordingly, in comparison with conventional vacuum apparatus employing conventional high vacuum pumps disposed exteriorly of the chamber to be evacuated, the instant arrangement provides a significantly higher rate of gas collection or pumping speed.

For example, it is calculated that the pumping speed of apparatus in which the high vacuum pump is disposed within the apparatus, as herein disclosed, is about twice as fast as when the identical high vacuum pump is disposed outside the apparatus and coupled thereto by a 6 inch diameter duct having a length of 10 inches.

Other types of known high vacuum pumps can be used, e.g., magnetic ion or differential ion-type pumps. Similarly, a cryogenic pump comprising panels chilled by a peltier process rather than by cryogenic fluids can be used.

OPERATION

With the pump 18 enclosure 20 in its downward, sealed relation around the pump 18, the main enclosure 12 is lifted and a number of wafer loaded pallets 46 are mounted on the carrousel 54. The main enclosure 12 is then lowered to seal the apparatus 10, and pump down of the apparatus is begun by the roughing pump through the duct 16. When the pressure within the apparatus reaches about 100 torr, the tandemly arranged turbomolecular and foreline pumps are used to further evacuate the apparatus through the duct 17 to a pressure of about 5 × 10⁻⁵ torr. Thereafter, the pump enclosure 20 is raised within the apparatus 10 to expose the pump 18 to the surrounding portions of the apparatus, the pump 18 then cooperating with the turbomolecular pump, which remains in operation throughout all the following operations of the apparatus, to reduce the pressure to about 5 × 10⁻⁷ torr.

As previously described, the presence of the pump 18 directly within the apparatus 10 significantly increases the rate at which gases are collected during the high vacuum pump down process.

When titanium or other reactive materials, such as tantalum, is one of the materials sputter deposited in the inventive apparatus, a further pumping sequence is preferably done prior to the start of the workpiece deposition process. Thus, the pump enclosure 20 is again lowered into sealing relation about the pump 10, and argon gas is admitted into the apparatus at a flow rate sufficient to maintain the pressure within the apparatus at a pressure of between about 5 × 10⁻³ to 10⁻² torr. At this time, as shown in FIG. 2, each shutter aperture 80 and 82 is disposed about 145° (center to center) counterclockwise from the target 34a and 38a, respectively, with which it will shortly cooperate, the workpiece pallets 46 thus being totally shielded from the targets 34a and 38a by the shutter 66. A voltage differential of about 2000 volts at a frequency of 13.5 mHz is then applied between the shutter 66 and the two targets 34a and 38a to initiate sputtering of these targets. The shutter 66 is then rotated about 110° in a clockwise direction to expose substantially the entire outer surface of the shutter 60 (but not the pallets 46) to the targets 34a and 38a. Thus a large area layer of titanium is deposited onto the shutter.

The titanium or other reactive material layer is provided on the shutter 66 for two reasons. One, as is conventional, a preliminary sputtering of the targets is done to clean the targets of various surface contaminants. Second, by providing the large area titanium layer, a quite effective getter for reactive gases, e.g., oxygen, nitrogen, and water vapor, is provided.

To continue the further pumping sequence, the flow of argon is then discontinued, the apparatus 10 is again pumped down to about 5 × 10⁻⁵ torr by the turbomolecular pump, the high vacuum pump 18 is again exposed, and the apparatus is then further pumped down to about 2 × 10⁻⁷ torr by the pump 18 and the turbomolecular pump. The presence of the titanium gettering layer significantly reduces the time required to pump down the system from 5 × 10⁻⁷ torr to 2 × 10⁻⁷ torr. That is, since a preliminary sputtering of the titanium targets must be done to clean the targets, such preliminary sputtering is utilized to provide a more rapid and efficient pump down of the system.

Having now achieved a quite low pressure, for the dual purposes of demonstrating that the system is substantially leak-tight and providing an environment substantially free of contaminating gases, the deposition process is started. Thus, the pump 18 is again isolated from the surrounding apparatus by the enclosure 20, argon is readmitted into the apparatus at a rate to maintain therein a constant pressure of between about 5 × 10⁻³ to 10⁻² torr (the pump 18 being isolated to prevent its being unnecessarily loaded with argon), and a sputtering voltage is applied between the pallets 46 and the targets 34a and 38a to again cause sputtering of these targets.

Figure 5:
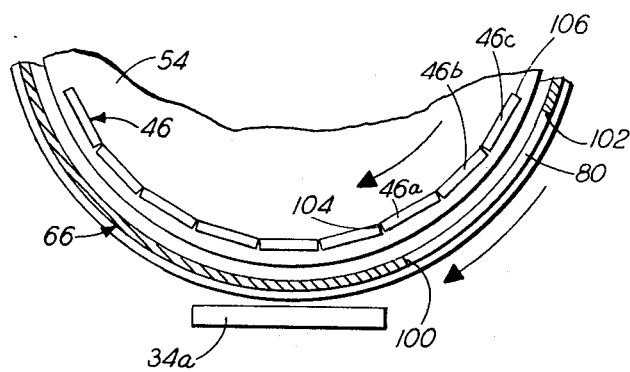
FIG. 5 is a schematic plan view of a portion of the apparatus showing the relative positioning of rotatable portions thereof at the starting of an operating cycle.

At this time, the shutter apertures 80 and 82 are disposed about 35° in a counterclockwise direction from their associated targets 34a and 38a, respectively (see FIG. 5, which shows, schematically, only a portion of the apparatus), the workpiece pallets 46 still being shielded from the target 34a and 38a by the shutter 66. In the portion of the deposition process about to be described, the two oppositely disposed targets 34a and 38a are simultaneously sputtered, and pallets 46 on opposite sides of the carrousel 54 are simultaneously coated with titanium, one-half the pallets 46 being exposed to and coated by the target 34a, and the remaining pallets 46 being coated by the target 38a. The purpose of this simultaneous sputtering is to decrease the time required to process all the workpieces. The cooperation among the carrousel 54, the shutter 66, and the targets 34a and 38a is identical at each side of the apparatus, hence the following description of the deposition from the target 34a is also applicable to the simultaneous deposition from the target 36a.

At the start of the deposition process, both the shutter 66 and the carrousel 54 are rotated in synchronism, i.e., at the same angular rate, to advance both the aperture 80 and those particular pallets 46 at this time directly behind, and thus exposed by the aperture 80, across the face of the target 34a. That is, at the start of the deposition cycle, a particular group (FIG. 5) of three pallets (designated 46a, 46b, and 46c) is in direct alignment with the shutter aperture 80, the edges 100 and 102 of the aperture 80 being in radial alignment with the outside edges 104 and 106 of the outside pallets 46a and 46c. This particular alignment is maintained as both the shutter 66 and the carrousel 54 are initially rotated to advance the aperture 80 across the face of the target 34a. During such advancement, material from the target 34a is sputter deposited onto the thus exposed pallets 46a–46c.

Figure 6:
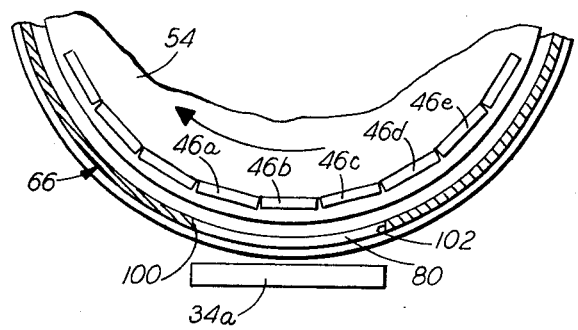
FIGS. 6 and 7 are views similar to that of FIG. 5 showing the apparatus at successive portions of the operating cycle.

When the aperture 80 arrives in full alignment with the target 34a, i.e., on centers therewith (FIG. 6), further movement of the shutter is stopped while rotation of the carrousel is continued at a constant rate. At this instant, those three pallets 46a through 46c then exposed through the aperture 80 to the target 34a begin passing beyond the leading edge 100 of the aperture 80 and behind the shutter 66. Similarly, successive pallets 46d, 46e, etc., on the rotating carrousel 54 begin reaching the trailing edge 102 of the aperture and are exposed to the target 34a as they pass the now stationary aperture 80. Passing the pallets 46 at a continuous rate past the target 34a, it is found, is a simple and effective means for uniformly depositing material across the face of each workpiece.

The purpose of the described relative movements of the shutter and carrousel is to make full use of the pallet mounting capacity of the carrousel while insuring that all the pallets are uniformly exposed to the target. For example, if the shutter aperture 80 were fixedly positioned in alignment with the target 34a, any pallets in alignment with the aperture at the start of the sputtering process would not be identically exposed to the target as those pallets which move, at a continuous rate, from a position behind the shutter, into alignment with the aperture, and then again behind the shutter. That is, using a continuous rate of rotation of the carrousel 54, those pallets which are initially exposed to the target at the start of the sputtering process, and thus already at least partly advanced across the face of the target, receive less than the normal amount of exposure to the target as these pallets are rotated further past the target and behind the shutter.

To avoid this under exposure of these initially exposed pallets, one solution, with an immobile shutter, is to provide a gap in the pallet array so that no pallets are in alignment with the shutter aperture at the start of the shuttering cycle, all the pallets thus experiencing the same exposure to the target. A disadvantage of this, however, is that the production capacity of the apparatus is reduced in accordance with the size of the pallet gap.

An alternate solution, with an immobile shutter aperture and pallets disposed in alignment therewith at the start of the sputtering cycle, is to re-expose those underexposed pallets to the target for a time adequate to compensate for the initial underexposure thereof. A difficulty with this, however, is that the separate exposure of the workpieces provides separate and discrete layers of the deposited material; there being, for certain materials, a distinct interface between the separately deposited layers. In some instances, depending upon the particular materials involved and how the workpieces are to be used, this is objectionable. With the relative shutter-carrousel movement sequence described above, however, uniform exposure of the various workpieces is obtained without the need for separate, compensating re-exposures.

Figure 7:
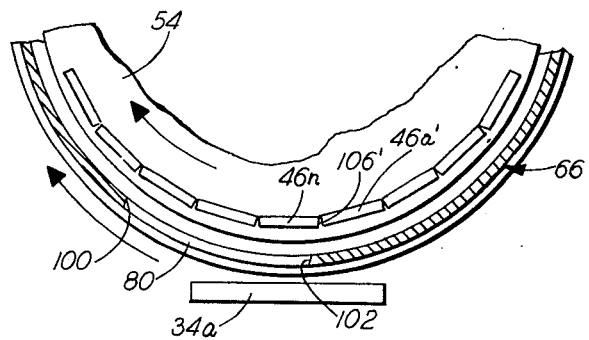

Towards the end of the titanium deposition cycle, the shutter 66 is again moved in synchronism with the carrousel 54. Thus as shown in FIG. 7, when the trailing edge 106' of the last pallet 46n to be exposed to the target 34a is rotated into radial alignment with the trailing edge 102 of the aperture 80, the shutter 66 is again rotated in synchronism with the carrousel 54 such that the alignment of the two edges 102 and 106' is maintained as the last pallet 46n (the "nth" pallet, in this embodiment, being the 13th pallet) is moved across the face of the target 34a. The result of this is that the last pallet 46n is exposed to the target 34a exactly as all the other pallets were exposed, while the pallet immediately following the last pallet, i.e., the first pallet 46a' of the other half of the pallets which had been exposed to the other target 38a, is shielded from the target 34a and thus not subject to having a separate layer of titanium deposited thereon.

After the titanium deposition cycle, the platinum targets 36a and 40a are pre-sputtered to clean them of surface contaminents, and the above-described deposition process, including the synchronous movements of the shutter 66 and the carrousel 54, is performed to deposit platinum on the workpieces. This completes the workpiece treating process.

As above-described, the cryogenic pump 18 collects and stores gases on the outer surfaces thereof. Periodically, during cleaning of the apparatus, the pump 18 is heated, as by passing hot nitrogen through the pump tubes 90 and 92, and the frozen gases are "boiled" off the pump.

While the invention has been described in connection with a sputtering apparatus, the invention has utility in other types of vacuum treating apparatus, e.g., filament evaporation and electron beam evaporation coating machines.

What is claimed is:
1. A sputtering apparatus comprising:
a cylindrical vacuum chamber having therewithin;
   a. a vacuum pump disposed along the longitudinal axis of said chamber,
   b. a cylindrical workholder assembly concentric with and disposed around said pump,
   c. a cylindrical shutter concentric with and disposed around said workholder assembly, said shutter having at least one longitudinally extending opening through a wall thereof, and
   d. at least one longitudinally extending sputtering target mounted on a wall of said chamber;
means for rotating said workholder assembly about said axis for disposing successive portions of said workholder assembly into radial alignment with said at least one target; and
means for selectively disposing said at least one opening into alignment with said at least one target.

2. The apparatus of claim 1 including a pump closure member mounted for movement within said chamber into pump enclosing position for isolating said vacuum pump from surrounding portions of said chamber and into pump exposure position for exposing said vacuum pump to said surrounding portions.

* * * * *